United States Patent [19]

Leunbach

[11] Patent Number: 5,287,854
[45] Date of Patent: Feb. 22, 1994

[54] ELECTRON SPIN RESONANCE ENHANCED MRI USING AN ECHO PLANAR IMAGING TECHNIQUE

[75] Inventor: Ib Leunbach, Dragör, Denmark

[73] Assignee: Nycomed Innovation AB, Malmo, Sweden

[21] Appl. No.: 768,202

[22] PCT Filed: Apr. 12, 1990

[86] PCT No.: PCT/EP90/00604
§ 371 Date: Oct. 24, 1991
§ 102(e) Date: Oct. 24, 1991

[87] PCT Pub. No.: WO90/13047
PCT Pub. Date: Nov. 1, 1990

[30] Foreign Application Priority Data
Apr. 24, 1989 [GB] United Kingdom ............ 8909270.4

[51] Int. Cl.$^5$ ............................................. A61B 5/055
[52] U.S. Cl. ............................. 128/653.2; 128/653.4; 324/309; 324/316
[58] Field of Search ................... 128/653.2, 653.4; 324/307, 309, 316

[56] References Cited

U.S. PATENT DOCUMENTS

| 4,165,479 | 8/1979 | Mansfield . |
| 4,384,255 | 5/1983 | Young et al. . |
| 4,509,015 | 4/1985 | Ordidge et al. . |
| 4,628,264 | 12/1986 | Rzedzian . |
| 4,694,253 | 9/1987 | Le Roux .................. 128/653.2 |
| 4,719,425 | 1/1988 | Ettinger . |

FOREIGN PATENT DOCUMENTS

| 0270320 | 6/1988 | European Pat. Off. . |
| 0291282 | 11/1988 | European Pat. Off. . |
| 0296833 | 12/1988 | European Pat. Off. . |
| WO90/02345 | 3/1990 | PCT Int'l Appl. . |
| 2056078 | 3/1981 | United Kingdom . |
| 2128339 | 4/1984 | United Kingdom . |
| 2207766 | 2/1989 | United Kingdom . |

OTHER PUBLICATIONS

Mansfield, *J. Phys. C: Solid State Phys.*, 10, L55–58, 1977.
Rzedzian, *Radiology*, 161,(P):333, 1986.
Bangert et al., *J. Phys. E. Sci. Instrum.*, 15, 235–239, 1982.
Chapman et al., *Magnetic Resonance in Medicine*, 5, 246–254, 1987.
Mansfield et al., *J. Mag. Res.*, 29, 355–373, 1978.
Lurie et al., *J. Mag. Res.*, 76, 366–370, 1988.

*Primary Examiner*—Ruth S. Smith
*Attorney, Agent, or Firm*—Bacon & Thomas

[57] ABSTRACT

There is provided an improved magnetic resonance imaging procedure which essentially combines electron spin resonance enhanced MRI with echo planar imaging MRI.

11 Claims, 3 Drawing Sheets

ELECTRON SPIN RESONANCE ENHANCED MRI USING AN ECHO PLANAR IMAGING TECHNIQUE

This is a United States national phase application of International Application Number PCT/EP90/00604, filed Apr. 12, 1990.

BACKGROUND OF THE INVENTION

The present invention relates to improvements in and relating to magnetic resonance imaging (MRI) and in particular to apparatus for and methods of electron spin resonance enhanced magnetic resonance imaging (ESREMRI).

ESREMRI, described by us in EP-A-296833 (Leunbach), is a method of magnetic resonance imaging in which amplification of the nuclear magnetic resonance signal, the free induction decay (FID) signal, is achieved by stimulating an electron spin resonance transition of a paramagnetic species present in the subject being imaged. Stimulation of the ESR transition leads to a polarization of the nuclear spin system responsible for the FID signals from which the magnetic resonance (MR) image of the subject is generated. This so called dynamic nuclear polarization is in effect an overpopulation, relative to equilibrium values, of the excited nuclear spin state and can be so large that the FID signal may be amplified by a factor of well over 100.

Using this technique, MR images may be generated by conventional imaging procedures, such as for example two and three dimensional Fourier transform, with enhanced signal to noise (SN) ratios (due to the amplification of the FID signal) and/or with shorter image acquisition times (since the nuclear spin system does not have to be allowed to relax towards equilibrium over a period comparable with $T_1$, the spin-lattice relaxation time, for example about 1 second, between each excitation /FID signal detection cycle) and/or at lower strength primary magnetic fields than are conventionally utilized in MRI, e.g. 0.002 to 0.1 T or lower.

ESREMRI involves exposing the subject being imaged to pulses of electromagnetic radiation of frequencies selected such that ESR and NMR transitions are stimulated.

These frequencies are of course dependent on the strength of the primary magnetic field of the imaging apparatus; however, since, at the field strengths conventionally used in MRI, the ESR and NMR stimulating radiations are generally microwave (MW) and radiofrequency (RF) radiations, for the sake of convenience the ESR and NMR stimulating radiations will be referred to hereinafter as being MW and RF radiations respectively.

To maximize the FID signal enhancement in ESREMRI, the ESR transition(s) of the paramagnetic species, which may be naturally present in the subject being imaged but more generally will be administered to the subject as a contrast agent, should be stimulated at or near saturation level for a period leading up to the initial RF pulse of the RF pulse/FID signal detection cycle of the MR image acquisition procedure.

Exposure of live subjects to electromagnetic radiation of RF or MW frequencies (including the radiations of lower frequencies than are conventionally considered to be MW or RF but which are encompassed herein by those terms by virtue of the definition given above) may cause undesirable heating of the subject's tissues to occur and clearly it is essential for a diagnostic technique such as MRI (and ESREMRI) that the temperature increases in the tissue be kept down to an acceptable level.

To avoid excessive RF heating, there are recommendations for conventional MRI that the maximum radiation exposure, the specific absorption rate (SAR), should be about 1-8 W/kg bodyweight during the imaging procedure. If MRI is conducted in accordance with these recommendations, any tissue temperature rises should be acceptably low, e.g. less than about 1° C., even for extended imaging periods.

Irradiation at power levels well above those recommended values however can be tolerated as long as the pulse duration of such radiation is short. Indeed, where pulsed RF or MW radiation is applied its heating effect may be lower than that of continuous wave radiation even where the SAR averaged over the whole exposure period may be much higher. Thus, some MR imagers operate using pulsed RF radiation where the SAR calculated for each pulse far exceeds the recommended maximum but where the SAR averaged over the exposure period is below that maximum.

As mentioned above, ESREMRI involves exposing the subject being imaged not just to the nuclear magnetic resonance stimulating RF radiation that is conventional within MRI, but also to electron spin resonance stimulating MW radiation. Accordingly, it is particularly important in in vivo ESREMRI to avoid undue exposure of the subject to MW radiation whereby to avoid undue heating of the subject's tissues.

In order that MW exposure be kept to an acceptable level we suggested in EP-A-296833 that any paramagnetic contrast agent used as the source of the MW stimulated ESR transitions should have an ESR spectrum in which the stimulated transition(s) should have a linewidth of less than 1 gauss. This effectively excluded from consideration the paramagnetic metal compounds, e.g. chelates, salts, etc., that have been found in conventional MRI to be effective $T_1$ contrast agents. Instead EP-A-296833 focused attention on the suitability as ESREMRI contrast agents of various stable free radicals, such as for example nitroxides. However, those nitroxide stable free radicals which have ESR linewidths of less than 1 gauss generally are less efficient as $T_1$ contrast agents in MRI—more specifically they generally have lower relaxivities or specific relaxation rate ($1/T_1$) enhancement values than do the paramagnetic metal species—containing $T_1$ contrast agents. Accordingly, up to now, choice of ESREMRI as an imaging technique has meant that a relatively low relaxivity contrast agent had to be used and that contrast agent dosages have had to be relatively high.

We have now found that MW exposure may be reduced or maintained within acceptable levels and that the choice of suitable contrast agents may be expanded by performing ESREMRI using the Echo Planar Imaging (EPI) technique developed by Mansfield for conventional MRI (see Mansfield P, J.Phys.C.10:L55–58 (1977)). The new technique according to the invention moreover represents an improvement in the performance of EPI since ESREMRI may be performed using primary magnetic fields lower in field strength than those primary fields generally used in MRI and may thus benefit from all the advantages of operating at lower primary field strengths.

Thus, whereas in MRI techniques such as back projection and two- and three-dimensional Fourier transform generation of a single image requires many RF excitation/FID signal detection cycles, in EPI a single RF excitation/FID signal detection cycle may be all that is required. This is made possible by echo regeneration of FID signals by rapid and repeated switching of the polarity of the read gradient. As a result of this rapid switching, the magnetic field variation (dG/dt) experienced by the subject being imaged can be high. Rapid magnetic field changes are considered undesirable for live subjects, but by operating at the low primary field strengths of for example 500 gauss or below, especially 200 gauss or below, that are utilizable for ESREMRI, smaller magnitude magnetic field gradients than are conventional in MRI may be used and as a result the magnetic field variation dG/dt in EPI may be reduced, or the FID signal utilization may be enhanced by switching the gradient polarity more rapidly.

SUMMARY OF THE INVENTION

Thus, viewed from one aspect the present invention provides a method of electron spin resonance enhanced magnetic resonance imaging characterized in that imaging is performed by an echo planar imaging technique.

Viewed from another aspect the present invention provides a method of electron spin resonance enhanced magnetic resonance imaging of a human or non-human animal subject, wherein free induction decay signal detection is effected during imposition of a magnetic field read gradient across said subject, characterized in that the polarity of said read gradient is repeatedly inverted.

Performed as a "single-shot" imaging technique, the method of the invention may thus for example comprise the following steps:

(a) if required, introducing a paramagnetic contrast agent into a subject, (b) if required, imposing a primary magnetic field on said subject, (c) exposing said subject to a first radiation of a frequency selected to excite an electron spin resonance transition in a paramagnetic species, e.g. said paramagnetic contrast agent, in said subject, (d) exposing said subject to at least one pulse of a second radiation of a frequency selected to excite nuclear spin transitions in selected nuclei in said subject, (e) imposing on said subject at least one spatial information encoding magnetic field gradient, (f) imposing on said subject a series of magnetic field read gradient pulses, said gradient pulses or sets of said gradient pulses within said series being of alternating polarities, (g) during at least part of the time said read gradients are imposed, detecting the free induction decay signal from said selected nuclei, and (h) generating from said detected signals an image of at least part of said subject.

Insofar as step (b) of the method of the invention is concerned, it should be noted that the method may be performed using extremely low field strength primary magnets or even using the earth's ambient magnetic field as the primary magnetic field. Low field operation of ESREMRI is discussed in EP-A-296833 and in WO-A-90/02345 (Leunbach).

In the method of the invention the dynamic nuclear polarization step, step (c), should precede, but may overlap with, the initial pulse of RF radiation of the RF excitation/FID signal detection cycle. Any delay between termination of the MW pulse and commencement of the RF pulse should preferably be avoided or kept to a minimum.

In the method of the invention, in the read gradient imposition step, step (f), successive gradient pulses may if desired vary in magnitude and/or duration.

The time variation of the read gradient (e.g. Gx), and indeed of the other magnetic field gradients, in the method of the present invention may be in any manner suitable for use in any version of Echo Planar Imaging. Thus, for example, Gx may simply be repeatedly reversed in polarity or, more preferably, it may continuously vary, e.g. approximately sinusoidally, or it may be discontinuous, e.g. occuring as discrete blips of alternating polarities. The literature regarding EPI is extensive and the reader is referred particularly to the publications of Mansfield and Rzedzian and their co-workers. Particular attention in this regard is drawn to EP-A-270320 (Rzedzian), U.S. application 4628264 (Rzedzian), U.S. application 4165479 (Mansfield), GB-A-2056078 (Young), U.S. application 4384255 (Young), U.S. application 4509015 (Ordigde), GB-A-2128339 (Mansfield), EP-A291282 (Mansfield), Rzedzian and Pykett, Radiology 161(P): 333 (1986), Bangert and Mansfield, J. Phys. E. 15: 235–239 (1982), Mansfield and Morris "Advances in Magnetic Resonance: NMR Imaging in Biomedicine", S. Waugh Ed.) Suppl. 2, Academic Press, N.Y., 1982, Chapman et al., Magn. Res. Med. 5: 246–254 (1987) and Mansfield and Pykett, J. Mag. Res. 29: 355–373 (1978). (The disclosure of these and all other documents mentioned herein are incorporated herein by reference).

In conventional MRI techniques, two dimensional Fourier transform for example, spatial information is encoded into the FID signal by imposing a series of magnetic field gradients on the primary magnetic field, e.g. by imposing gradients in the x, y and z directions, at different stages of the RF excitation/FID signal detection cycle. Conventionally, a gradient, the read gradient, is imposed during the period when FID signal detection occurs. This however causes the FID signal to decay much more rapidly than it would in the absence of the read gradient and indeed the FID signals generally are only strong enough to be readily detected for periods of the order of $10^{-4}$ sec, even though $T_2$ in the body may be of the order of $2-20 \times 10^{-2}$ sec. (The FID signal envelope resembles a sinc function and generally first passes through zero at about 10 microseconds). The EPI technique involves repeatedly reversing the polarity of the read gradient so that its dephasing effect is reversed and the FID signal builds back up again. The characteristic decay time for the overall envelope of the FID signal thus becomes $T_2^*$ and the FID signal is thus much more efficiently utilized. Gradient reversal, if effected after the FID signal has died out, will result in an "echo" signal developing. Alternatively, if gradient reversal is effected before the FID signal has died out, e.g. at a rate of about 10 kHz, signal intensity will build up again before it has completely decayed. Although such rapid gradient reversal leads to efficient utilization of the FID signal, it does however also lead to very high magnetic field change (dG/dt) values and there may be difficulty in operatus in this fashion using conventional primary field strengths and gradient magnitudes sufficient to provide adequate spatial resolution while still keeping the magnetic field change value within acceptable limits.

Besides the limitations imposed by the Fourier transformation data extraction technique, for the read gradient to encode spatial information into the FID signal the gradient across each volume element must also be comparable to, if not larger than, the intrinsic inhomogeneities of the primary magnetic field, e.g. inhomogeneities due to imperfections in coil winding and geometries and/or variations in current in the magnet's coils.

As explained in EP-A-296833, the FID signal enhancement, which can be over a hundred fold, which results from the use of the ESREMRI technique allows satisfactory SN ratio FID signals to be detected even at extremely low strength primary magnetic fields. Accordingly, the combination of ESREMRI and EPI may allow the use in EPI of lower strength primary magnetic fields and hence of higher frequency read gradient reversal, of lower magnitude read gradients and of higher inhomogeneity (and hence less expensive) magnets.

With the use of smaller read gradients, a double advantage is gained since not only is the magnetic field change on inversion smaller, but also the gradient's FID signal reducing effect is smaller.

Thus, in a particularly preferred embodiment of the invention, the primary field strength is less than 1T, preferably less than 0.8T, especially preferably less than 0.1T, more preferably less than 0.08T (800 gauss) and particularly preferably 200 gauss or less, e.g. 20 to 200 gauss.

Using gradient reversal, it is possible simply to enhance the SN ratio of the total detected FID signal by a factor of the order of $Ne^{\frac{1}{2}}$ (where Ne is the number of reversals, assuming $Ne \times 2\tau$ is less than or much less than $T_2$ where $2\tau$ is the spacing of the FID echoes). To this extent, EPI could be used simply as a modification of a conventional MR imaging procedure such as 2-dimensional Fourier transform, etc.

The main attraction of EPI, however, is that it is possible using this technique to reduce the number of RF excitation/FID signal detection cycles necessary for the generation of $N \times N$ voxel images from about N (generally 64 to 1024) down to as low as 1. To do this, it is necessary to vary the imposed encoding gradients (e.g. read and phase encoding gradients) e.g. up to N times, within the or each cycle. Since in conventional MRI such cycles have to be spaced apart by about 1 second to allow the nuclear spin system to relax towards equilibrium, the image acquisition time, the total time required to collect all the data necessary to generate one image, can thus be reduced from as much as 10-30 minutes down to the order of $T_2$, e.g. 0.1 sec.

Insofar as ESREMRI is concerned, use of the EPI technique thus affords the opportunity to reduce the total MW exposure of the subject by reducing the number of RF excitation/FID signal detection cycles and thus the number of MW exposure periods required for the acquisition of a single image. Most preferably therefore the method of the present invention will be a so-called single shot imaging procedure requiring only one period during which the subject is exposed to MW radiation in order to generate the desired dynamic nuclear polarization within the nuclear spin system of the nuclei responsible for the detected FID signals. During this period MW exposure may be continuous or discontinuous.

Since the EPI technique can be used to reduce the number of MW exposure periods for each image acquisition period, higher MW exposure during the (or each) MW exposure period can be tolerated. This is especially true for single shot imaging according to the method of the invention in which image generation requires the subject to be exposed to MW radiation during only one dynamic nuclear polarization (DNP) generation period, generally 10 to $10^5$ ms, preferably 200 to $10^4$ ms, especially preferably 500 to 2000 ms.

Accordingly, using the method of the invention it is possible to obtain a higher degree of saturation of the ESR transition and have a higher degree of DNP of the paramagnetic species by using higher MW power levels during the DNP period or alternatively it is possible to use as the contrast agent paramagnetic species having broader ESR linewidths than the values suggested in EP-A-296833.

In particular, using the method of the invention it is possible to utilize as paramagnetic contrast agents species having ESR linewidths of up to 2 gauss, e.g. from 0.01 to 2 gauss, preferably up to 1.5 gauss, especially preferably between 1.0 and 1.5 gauss. Thus, the range of paramagnetic species utilizable as ESREMRI contrast agents is significantly extended by the present invention and, while the linewidths of conventionally preferred gadolinium containing MRI $T_1$ contrast agents, such as Gd DTPA, Gd-DTPA-Bismethylamide, GA DOTA, Gd DO3A etc, will still be too large for these compounds to function effectively as ESREMRI FID signal enhancing contrast agents, the present invention makes it possible to use certain relatively narrow ESR transition linewidth materials as ESREMRI FID signal enhancing contrast agents.

Viewed from a further aspect therefore, the present invention provides a contrast medium for use in FID signal enhancing in the ESREMRI methods of the invention, said contrast medium comprising a physiologically tolerable paramagnetic material having in its ESR spectrum a transition having a linewidth of between 1 and 2 gauss, together with at least one carrier or excipient.

Viewed from a yet further aspect, the invention also provides the use of such paramagnetic materials for the preparation of a diagnostic agent for use in a method of ESREMRI imaging of a human or non-human animal subject.

As mentioned earlier, one of the most significant benefits of the method of the invention is that it permits use in ESREMRI of high relaxivity paramagnetic materials as FID signal enhancing contrast agents. Increased relaxivity, although generally associated with increased ESR linewidth, is desirable since it means that the efficiency of the contrast agent in terms of required dosage is also increased. Thus, using the method of the invention it is possible and indeed desirable to use paramagnetic materials having a quality factor (Q) of at least 1, preferably at least 1.3, especially preferably at least 1.4, where Q is defined as follows $$Q = R_1/(LW)^2$$

where $R_1$ is the $T_1$ relaxivity in $mM^{-1}s^{-1}$ and LW is the ESR transition linewidth in gauss. For these purposes, relaxivity may be measured as the regression coefficient or gradient B in the equation $$y = A + Bx$$

where x is the concentration in mM of the paramagnetic species and y is $1/T_{10}$ (in $sec^{-1}$ — $T_{10}$ is the spin-lattice relaxation tissue $T_1$ for the solution containing the paramagnetic species) and A is the value of $1/T_1$ (in sec$^{-1}$) in the absence of the paramagnetic species (e.g. in a reference water/glycerol mixture (17:8 by volume) at 37° C.).

Viewed from a still further aspect the invention provides a diagnostic composition for use in the ESREMRI methods of the invention, said composition comprising a physiologically tolerable paramagnetic material having a quality factor of at least 1, preferably at least 1.5, together with at least one physiologically tolerable carrier or excipient.

The ESR linewidths referred to herein are the full widths at half maximum in the absorption spectrum at imaging conditions, e.g. at the imaged sites. Particularly, preferably however the linewidth criteria will be satisfied at the local concentration limits mentioned below.

The contrast medium may contain, besides the paramagnetic material, formulation aids such as are conventional for therapeutic and diagnostic compositions in human or veterinary medicine. Thus the agents may for example include solubilizing agents, emulsifiers, viscosity enhancers, buffers, etc. The agents may be in forms suitable for parenteral (e.g. intravenous) or enteral (e.g. oral) application, for example for application directly into body cavities having external escape ducts (such as the digestive tract, the bladder and the uterus), or for injection or infusion into the cardiovascular system. However, solutions, suspensions and dispersions in physiologically tolerable media will generally be preferred.

For use in in vivo diagnostic imaging, the contrast medium, which preferably will be substantially isotonic, may conveniently be administered at a concentration sufficient to yield a 1 micromolar to 10 mM concentration of the paramagnetic substance at the image zone; however the precise concentration and dosage will of course depend upon a range of factors such as toxicity, the organ targetting ability of the contrast agent, and administration route. The optimum concentration for the paramagnetic substance represents a balance between various factors. In general, operating with a primary magnet generating a 0.02 T field, optimum concentrations may lie in the range 1 to 10 mM, especially 3 to 9 mM, more especially 4 to 8 mM and particularly 4.5 to 6.5 mM. Compositions for intravenous administration preferably will contain the paramagnetic material at concentrations of 10 to 1000 mM, especially preferably 50 to 500 mM. For imaging of the urinary tract or the renal system however compositions may perhaps be used having concentrations of for example 10 to 200 mM. Moreover for bolus injection, the concentration may conveniently be 1 to 10 mM, preferably 3 to 9 mM etc.

In a still further aspect the invention provides a contrast medium for use in the ESREMRI methods of the invention, said contrast medium comprising a physiologically tolerable paramagnetic material, e.g. a stable free radical, e.g. a nitroxide, at a concentration of from 50 to 500 mM in a sterile physiologically tolerable liquid carrier, said paramagnetic material having an ESR transition with a linewidth of at least 1 gauss and up to 2 gauss, preferably up to 1.5 gauss, especially preferably from 1.2 to 1.5 gauss.

The paramagnetic material in the contrast media of the invention will preferably exhibit ESR linewidths of less than 2 gauss, especially preferably less than 1.5 gauss, at concentrations of up to 10 mM, especially at 1 or 2 mM, or even somewhat higher.

Besides the new contrast media according to the invention, the prior art ESREMRI contrast media, e.g. those described in EP-A-296833, may of course be used in the method of the present invention.

Viewed from a yet still further aspect, the invention also provides a magnetic resonance imager arranged for performing ESREMRI, comprising gradient imposing means for imposing at least one magnetic field gradient across a sample in said imager, detection means for detecting FID signals from a said sample, first control means for controlling said gradient imposing means, and second control means for controlling the operation of said detection means, characterized in that said first control means is arranged to impose across a said sample magnetic field read gradients of alternating polarities and in that said second control means is arranged to cause said detection means to operate during at least part of the time during which said read gradients are imposed.

The control means in the apparatus of the invention preferably comprises a computer, which may function as both the first and the second control means. Preferably this control means will also serve to control the imposition of the other field gradients and especially preferably also the MW and RF sources, e.g. to select the frequency bandwidths and central frequencies of the MW and RF pulses emitted during the image acquisition procedure. Furthermore, the computer will preferably be arranged for manipulation of the detected FID signals to generate one or more MR images of the subject.

The method of the invention is particularly suited to the imaging of samples of relatively small diameter (e.g. laboratory animals, limbs and other subjects for which a sample aperture diameter in the imaging apparatus of up to 20 cm, and preferably up to 10 cm, will suffice) and for the study of dynamic rather than static systems where the relative importance of temporal rather than spatial resolution increased.

BRIEF DESCRIPTION OF THE DRAWINGS

Preferred embodiments of the invention will now be described by way of example and with reference to the accompanying drawings, in which.

DETAILED DESCRIPTION OF THE PREFERRED EMBODIMENTS

Figure 1:
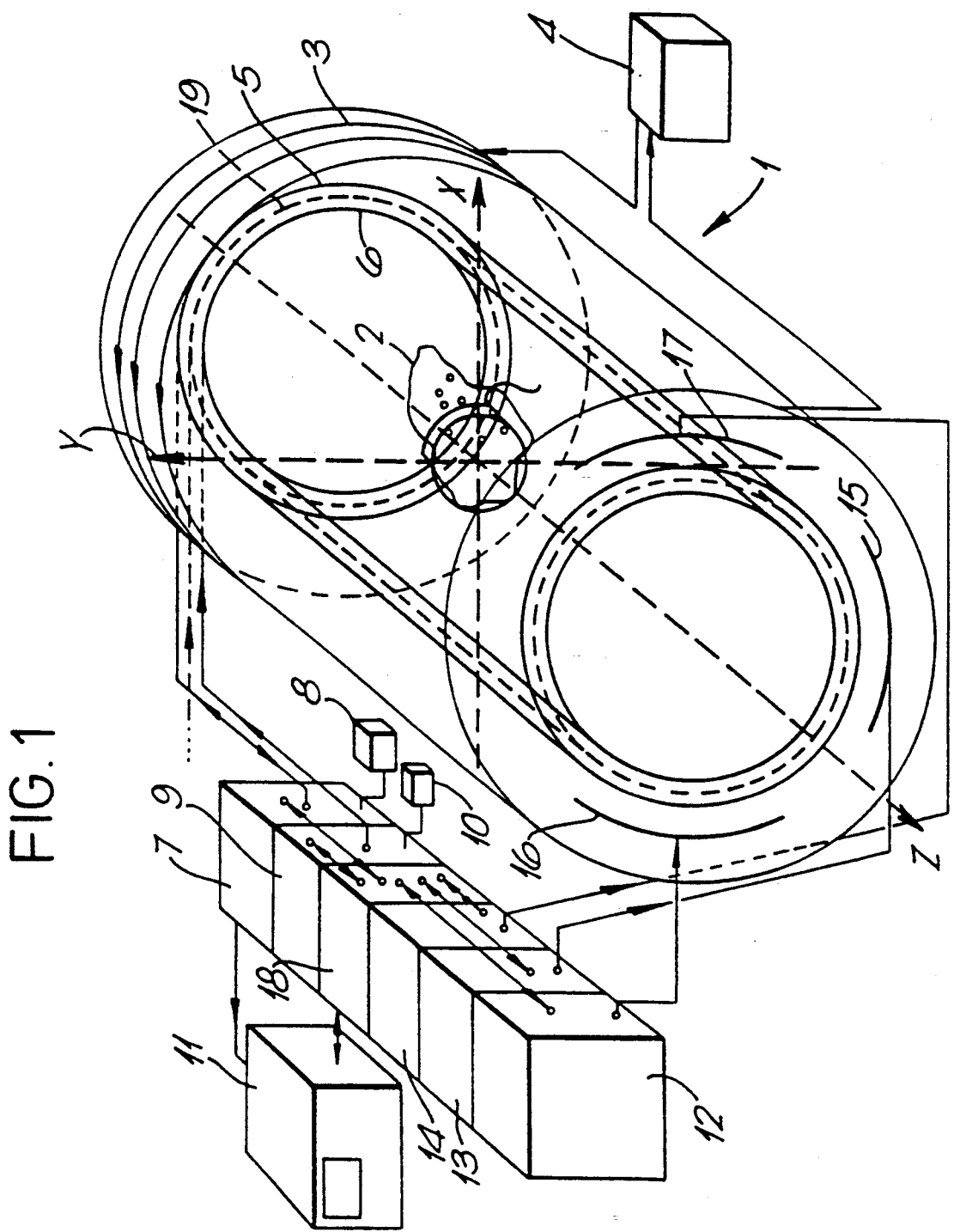
FIG. 1 is a schematic diagram of an ESREMRI imager according to the invention.

Referring to FIG. 1, there is shown an ESREMRI apparatus 1, having a subject 2, dosed with a paramagnetic contrast agent (e.g. a 30 g mouse dosed with 0.5 mmol/kg of a paramagnetic contrast agent, e.g. PROXYL D, PROXYL H, 4-amino-TEMPO, TEMPOL or another commercially available nitroxide stable free radical), placed at the axis of the coils of electromagnet 3. Power from DC supply 4 to electromagnet 3 enables the primary magnetic field, e.g. a 200 gauss field, to be generated.

The apparatus is further provided with resonators 5 and 6 for emitting the second (RF) and first (MW) radiations respectively. Resonator 5 is connected to RF transceiver 7 powered by power supply 8 and resonator 6 is connected, for example by waveguides, to microwave generator 9 which is powered by power supply 10. The resonators, especially resonator 6, may be so-called loop-gap resonators.

Microwave generator 9 may be arranged to emit MW radiation having more than one maximum frequency in order to excite more than one esr transition.

The frequency selection, bandwidth, pulse duration and pulse timing of the second and first radiations emitted by resonators 5 and 6 are controlled by control computer 11 and interface module 18.

Computer 11 also controls the power supply from power sources 12, 13 and 14 to the three pairs of Helmholtz coils 15, 16 and 17. The coils of coil pair 15 are coaxial with the coils of electromagnet 3 and the saddle coils of coil pairs 16 and 17 are arranged symmetrically about that axis, the Z axis, with their own axes mutually perpendicular and perpendicular to the Z axis. Coil pairs 15, 16 and 17 are used to generate the magnetic field gradients that are superimposed on the main field at various stages of the imaging procedure and the timing sequence for operation of the coil pairs and for operation of the MW generator and the RF transceiver is controlled by computer 11 and interface module 18.

Where a contrast agent is to be used which has a multiplet in its ESR spectrum, the apparatus may also be provided with decoupler comprising a further RF resonator 19 (shown with broken lines) connected to an RF transmitter and a power supply (not shown) and controlled by computer 11. The decoupler may be operated to emit a third radiation at a frequency selected excite the nuclear spin transition in non-zero spin nuclei in the contrast agent.

In operation in MRI, the power supply to the electromagnet 3 is switched on and an essentially uniform main magnetic field is generated within the cavity within its coils. The magnitude of the main field generated by electromagnet 3 is maintained essentially constant throughout the imaging procedure.

The subject 2, for example a patient, is placed within the coil cavity and after a short delay, for example several seconds, the imaging procedure can begin.

The imaging procedure used, e.g. the sequence of exposure of subject 2 to RF radiation from resonator 5, imposition of field gradients by coil pairs 15, 16 and 17 and detection of the FID signal by transceiver 7 may be substantially as in any conventional EPI technique (e.g. as described in the Mansfield and Rzedzian references mentioned above) with the inclusion of a period of DNP generating MW exposure at the beginning of the or each RF excitation/FID signal detection cycle. In the or each cycle, the DNP generating MW exposure period should generally be kept to the minimum required to generate the desired degree of DNP (the degree of DNP=$(P_{ex}-P_{gs})/(P_{gs}-P_{ex})$ where $P_{ex}$ and $P_{gs}$ are the excited and ground nuclear spin state populations and $P_{gs}$ and $P_{ex}$ are the ground and excited nuclear spin state populations at thermal equilibrium). Thus, while there may be some overlap between the periods of RF and MW irradiation there will generally be no overlap between MW irradiation and FID signal detection periods.

Figure 2:
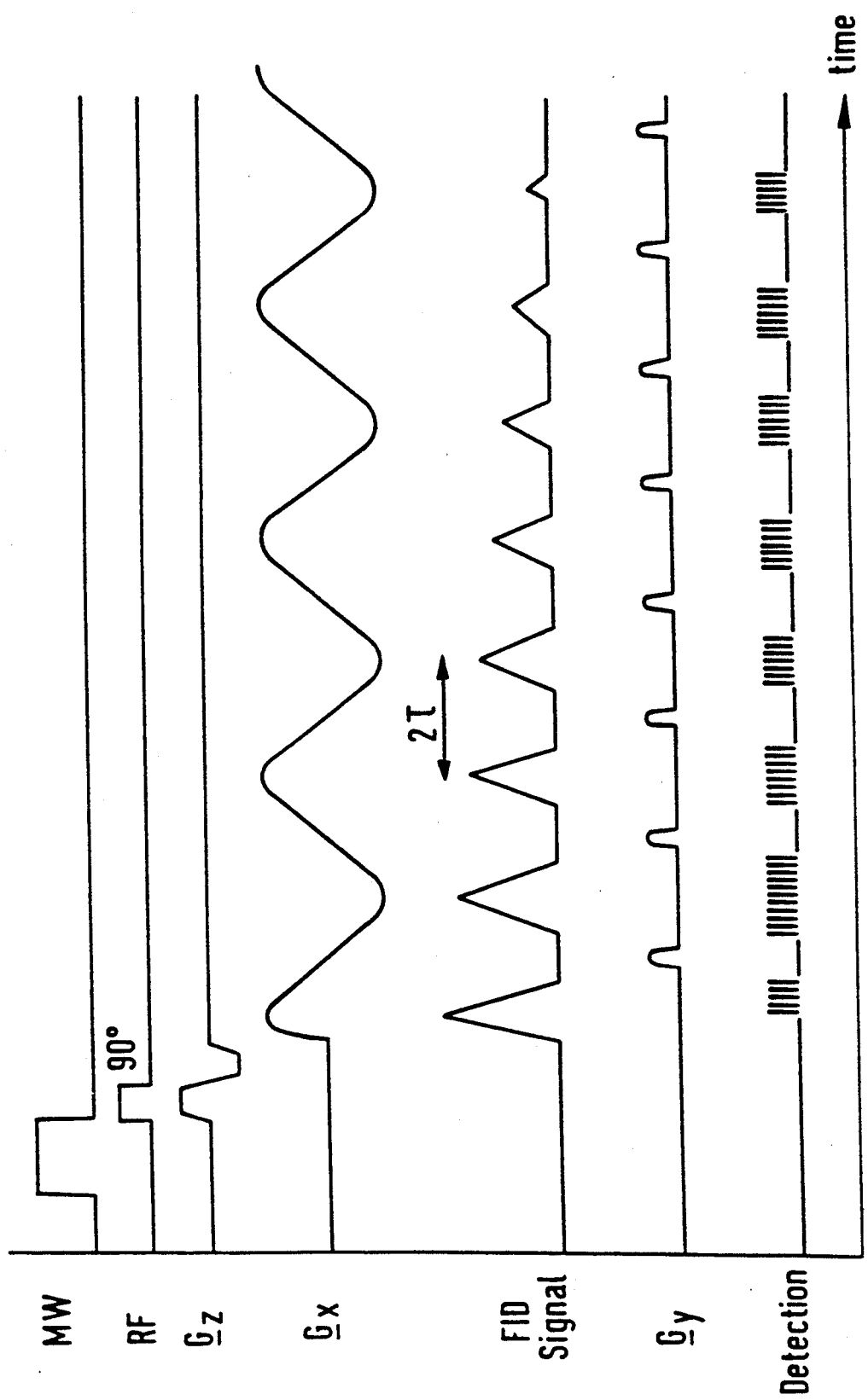
FIGS. 2 and 3 are schematic diagrams of the timing sequences for MW and RF pulses, read gradient imposition, FID signals and FID signal detection in single shot imaging procedures effected according to the method of the present invention.
Figure 3:
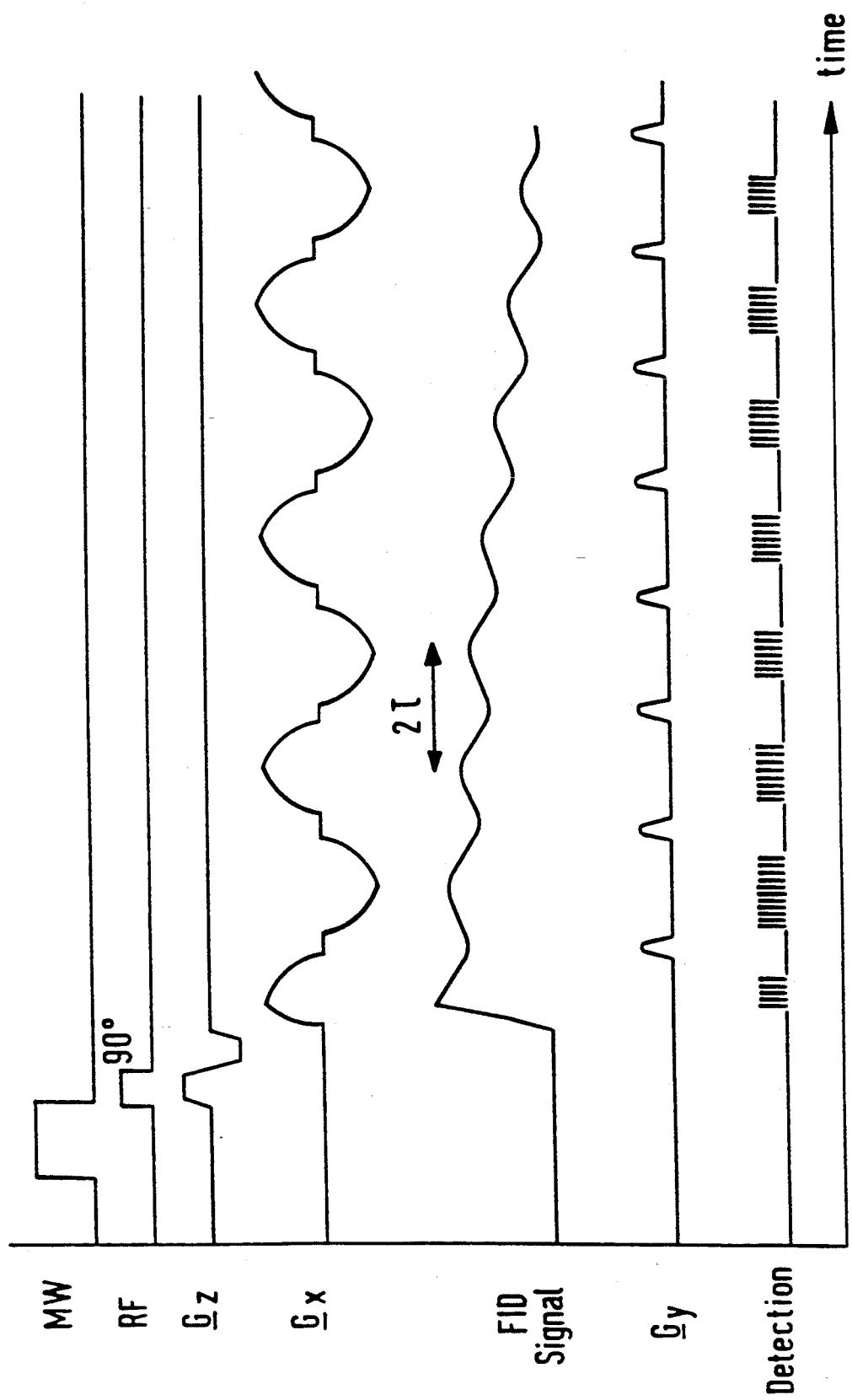

By way of example, timing sequences for single shot imaging are shown schematically in FIGS. 2 and 3. In the sequence of FIG. 2, the read gradient reversal rate is sufficiently slow, e.g. 0.5 ms between reversals, that the FID signal decays completely between reversals and reappears as an echo after reversal. In the sequence of FIG. 3, read gradient reversal is effected very rapidly, e.g. with 50 microseconds between reversals, so that the signal does not decay completely between reversals.

Phase encoding (Gv) and slice selection (Gz) gradient timings are also shown schematically in FIGS. 2 and 3. It will be appreciated that, as is conventional with EPI techniques, gradient magnitudes may be varied during the gradient imposition detection sequence to enable the spatial information for the generation of a full image to be encoded into the FID signals and echoes.

Using the method and apparatus of the invention, significant reductions in MW exposure in ESREMRI may be achieved and the range of contrast agents utilizable in ESREMRI is expanded.

What is claimed is:

1. A method of electron spin resonance enhanced magnetic resonance imaging of a subject performed by an echo planar imaging technique, said method comprising the following steps:
    (a) exposing said subject to a first radiation of a frequency selected to excite an electron spin resonance transition in a paramagnetic species in said subject,
    (b) exposing said subject to at least one pulse of a second radiation of a frequency selected to excite nuclear spin transitions in selected nuclei in said subject,
    (c) imposing on said subject at least one spatial information encoding magnetic field gradient,
    (d) imposing on said subject a series of magnetic field read gradient pulses, said gradient pulses or sets of said gradient pulses within said series being of alternating polarities,
    (e) during at least part of the time said read gradients are imposed, detecting the magnetic resonance signal from said selected nuclei, and
    (f) generating from said detected signals an image of at least part of said subject.

2. A method as claimed in claim 1 wherein said subject is a human or non-human animal.

3. A method as claimed in claim 2 comprising introducing into a subject a physiologically tolerable paramagnetic species having an ESR linewidth of up to 2 gauss.

4. A method as claimed in claim 3 wherein said paramagnetic species has an ESR linewidth of up to 1.5 gauss.

5. A method as claimed in claim 1 wherein prior to steps (a) to (f) a primary magnetic field is imposed on said subject.

6. A method as claimed in claim 5 wherein said imaging is effected using a primary magnetic field strength of less than 1T.

7. A method as claimed in claim 5 wherein said imaging is effected using a primary magnetic field strength of less than 0.1T.

8. A method as claimed in claim 5 wherein imaging is effected using a primary magnetic field strength of from 20 to 200 gauss.

9. A magnetic resonance imager for performing ESREMRI, comprising a first radiation source means for irradiating a sample with a first radiation of a frequency selected to excite an electron spin resonance transition in a paramagnetic species in said sample, a second radiation source means for irradiating said sample with at least one pulse of a second radiation of a frequency selected to excite nuclear spin transitions in selected nuclei in said sample, gradient imposing means for imposing at least one magnetic field gradient across said sample, detection means for detecting magnetic resonance signals from said sample, first control means for controlling said gradient imposing means, and second control means for controlling the operation of said detection means, wherein said first control means imposes across said sample magnetic field read gradients of alternating polarities and said second control means causes said detection means to operate during at least part of the time during which read gradients are imposed.

10. An imager as claimed in claim 9, wherein said first and second control means comprises a computer.

11. An imager as claimed in claim 9 further comprising magnetic field generating means for imposing a primary magnetic field on said sample.

* * * * *